United States Patent [19]

Lee

[11] Patent Number: 5,998,824

[45] Date of Patent: Dec. 7, 1999

[54] CAPACITOR STRUCTURE HAVING A LOWER ELECTRODE WITH A ROUGH SURFACE, A PLURALITY OF METAL LAYERS AND A NITRIDATION TREATED FILM

[75] Inventor: Young Jong Lee, Daejeon-si, Rep. of Korea

[73] Assignee: LG Semicon Co., Ltd., Chungcheongbuk-Do, Rep. of Korea

[21] Appl. No.: 09/001,634

[22] Filed: Dec. 31, 1997

Related U.S. Application Data

[62] Division of application No. 08/592,233, Jan. 26, 1996.

[30] Foreign Application Priority Data

Sep. 25, 1995 [KR] Rep. of Korea ...................... 95-31653

[51] Int. Cl.$^6$ .................................................. H01L 29/94
[52] U.S. Cl. ............................................ 257/309; 257/306
[58] Field of Search ..................................... 257/410, 412, 257/288, 306, 309, 532; 438/239, 255, 398

[56] References Cited

U.S. PATENT DOCUMENTS

| | | | |
|---|---|---|---|
| 4,638,400 | 1/1987 | Brown et al. | 361/304 |
| 5,182,232 | 1/1993 | Chhabra et al. | 437/200 |
| 5,223,081 | 6/1993 | Doan | 156/628 |
| 5,262,662 | 11/1993 | Gonzalez et al. | 257/307 |
| 5,418,180 | 5/1995 | Brown | 437/60 |
| 5,656,529 | 8/1997 | Fukase | 438/398 |

OTHER PUBLICATIONS

"Thickness Limitations of SiO$_2$ Gate Dielectrics for MOS ULSI", Wright, Peter J., et al., IEEE Transactions on Electron Devices, vol. 37, No. 8, pp. 1884–1892, Aug. 1990.

"An Advanced Fabrication Technology of Hemispherical Grained (HSG) Poly–Si for High Capacitance Storage Electrodes", Watanabe, H., et al., Extended Abstracts of the 1991 International Conference on Solid State Devices and Materials, pp. 478–480, 1991.

"Characterization of Ultra–Thin Capacitors Fabricated Using RTN Treatment Prior to CVD Ta$_2$O$_5$ Film Formation", Kamiyama, S., et al., Extended Abstracts of the 1992 International Conference on Solid State Devices and Materials, pp. 521–523, Aug. 1992.

"Ultrathin Ta$_2$O$_5$ Films on Rapid Thermal Nitrided Rugged Polysilicon for High Density DRAMS", Fazan, P. C., et al., Extended Abstracts of the 1992 International Conference on Solid State Devices and Materials, pp. 697–698, Aug. 1992.

*Primary Examiner*—Tom Thomas
*Assistant Examiner*—Douglas W. Owens
*Attorney, Agent, or Firm*—Morgan, Lewis & Bockius LLP

[57] ABSTRACT

A capacitor structure of a semiconductor device which includes a semiconductor substrate, a first metal layer formed on the substrate, and a second metal layer formed on the first metal layer. The first metal layer has a nitridation-treated film along its outer surface. A tungsten film having a rugged surface is formed on the entire outer surfaces of the first and second metal layers. Because of the nitridation-treated film along the first layer, the tungsten film will be uniformly distributed along the first and second metals. A thin dielectric film is then formed on the surface of the tungsten, followed by a third metal layer formed on the dielectric film.

9 Claims, 5 Drawing Sheets

CAPACITOR STRUCTURE HAVING A LOWER ELECTRODE WITH A ROUGH SURFACE, A PLURALITY OF METAL LAYERS AND A NITRIDATION TREATED FILM

This is a divisional of copending application Ser. No. 08/592,233 filed on Jan. 26, 1996.

BACKGROUND OF THE INVENTION

1. Field of the Invention

The present invention relates to a semiconductor device, and more particularly, to a capacitor structure of a semiconductor device and a method of manufacturing the same, which has a suitable capacitance for use in the highly integrated device.

2. Discussion of the Related Art

In general, as the integration of a semiconductor device (such as a dynamic random access memory (DRAM)) increases, the area available to the capacitor becomes more limited. Each memory cell is manufactured by forming a transistor and a capacitor, which are active elements, on a substrate of limited area. According to the already determined design rule, the capacitor must be formed on a substrate where the transistor occupies a fixed area. Thus, it is difficult to manufacture a memory cell having a capacitor with a large capacity since the area occupied by the capacitor is decreased to that extent.

In order to overcome the limited area and obtain a capacitor having a capacitance suitably large enough for a highly integrated device, capacitors having a three-dimensional structure such as a stacked, a trench, a cylindrical, and a fin structure are used. If such a three-dimensional structure is used, a problem arises with respect to the reliability of the capacitor's dielectric film.

When a capacitor having the conventional three-dimensional structure is manufactured, the capacitor dielectric film will normally be composed of oxide-nitride-oxide (ONO). The problem with the ONO film, however, is its limited dielectric constant. Thus, even if the capacitor is manufactured having the conventional three-dimensional structure, the capacitor structure needs to become more complex as the integration is increased in order to obtain the desired capacitance. Accordingly, the ONO film is not a very suitable dielectric.

It should also be noted that if the thickness of the capacitor dielectric film is decreased, the capacitance can be increased. Thus, using a thin film is important not only because it will enable the device to be further miniaturized, but also because it will improve the device's capacitance. For example, in the 256 Mb DRAM, the effective thickness of the dielectric film must be reduced to about 3 nm or less using a $SiO_2$ film.

However, research indicates that the effective thickness of the ONO film used now is limited to about 4 nm even if the nitridation anneal process is performed on it (refer to P. J. Wright and K. C. Saraswat, "Thickness limitation of $SiO_2$ gate dielectrics for MOS ULSI", IEEE Trans. on Electron Devices, vol. 37, no. 8, 1990). Accordingly, where the ONO film is used in a capacitor, the structure of the capacitor storage node needs to become more complex in order to obtain a large capacitance.

Such complexity causes a severe topology problem in the stacked capacitor (such as the cylindrical structure or the fin structure), thereby requiring a high level of planarization technology. Even if planarization is accomplished, it is difficult to perform the subsequent process. For example, a contact hole having a large difference in depth must be filled in the subsequent wiring process. Further, where the capacitor has a trench structure, a high aspect ratio is present. Therefore, it is difficult to perform the etching process to form the trench, the cleaning process, and the silicon-filling process during the manufacturing of the opposite electrode within the trench.

Two types of manufacturing methods have emerged as methods for solving the aforementioned problems. The first method manufactures a storage node using a hemispherical grained silicon (HSG). Under this method, the surface of the chemical vapor deposition (CVD) silicon used as a capacitor storage node is formed into a rugged morphology instead of a smooth morphology. This increases the effective capacitor surface area in the capacitor region, although the area is still limited by the design and structure of the capacitor and semiconductor.

When the above described CVD silicon is deposited at a temperature of about 600° C. or more, it has a smooth surface morphology such as with polycrystalline silicon. However, if the CVD silicon is deposited at a temperature of about 550° C. or lower, and is heat-treated at temperatures around 580–600° C., a rugged surface morphology is obtained whereby the hemispherical silicon grain protrudes. This hemispherical silicon grain increases the effective capacitor area to about 1.8–2.0 times that of the silicon surface of smooth morphology. Thus, a large capacitance can be obtained.

However, even if a HSG of good quality is obtained through the above described method, when the ONO film is used as the capacitor dielectric film, a capacitance of only about 9.1 $fF/\mu m^2$ can be secured with a high-step difference of about 0.8 $\mu m$. In the case of a capacitor having the cylindrical structure, a high-step difference of about 1 $\mu m$ or more is necessary. Thus, the problem of having to increase the complexity of the capacitor arises again.

The second method that has emerged uses a capacitor dielectric film having a large dielectric constant ($\bar{}r$) (e.g., tantalum pentaoxide ($Ta_2O_5$) ($\bar{}r.24$), PZT ($\bar{}r.2000$), BST ($\bar{}r.300$), and the like). The problem with these dielectrics is that if they are applied as a thin film, the dielectric constant is reduced rapidly and the leakage current is increased. This phenomenon will be described below.

In general, $Ta_2O_5$ uses a penta-ethoxytantalum (Ta $(OC_2H_5)_5$) as a source of Ta and injects $O_2$ gas to form an oxide film. The thin film is then formed using the low pressure chemical vapor deposition (LPCVD) method, the plasma-enhanced CVD method, or the electron cyclotron resonance (ECR) CVD method.

The dielectric constant of $Ta_2O_5$ is approximately 22–28, which is about 6 times that of $SiO_2$. Further, if the proper heat treatment is performed after forming the thin film, the leakage current decreases to about $10^{-9}$–$10^{-7} A/cm^2$ under an electric field of 4 MV/cm. This particular type of dielectric is thus appropriate for use in the capacitor of a highly integrated memory device.

However, where silicon is used as the storage node a further complication can arise. When depositing the silicon, oxidation of its surface cannot be avoided, and a $SiO_2$ film forms. Further, if heat treatment is performed after depositing the silicon, the $SiO_2$ film grows all the more. When such a $SiO_2$ film forms, the dielectric constant decreases and the desirable capacitance cannot be obtained.

One previously proposed solution to this problem was to nitrify the surface of the silicon layer constituting the storage node to form a silicon nitride film on the surface portion, followed by the depositing of the $Ta_2O_5$ film. As a result, improvements were reported in the dielectric constant, leakage current, and time dependent dielectric breakdown (TDDB) as compared to when the silicon layer is not nitrified (refer to "Satoshi Kamiyana, Pierre-Yves Lesaicherre, Akihiko Ishitana, Akir Sakai, Akio Tanikawa, and Iwao Nishiyama, Extended Abstracts of the 1992 International Conference on Solid Devices and Materials, pp. 521–523", "P. C. Fazan, V. K. Mathews, R. L. Maddox, A. Ditali, N. Sandler and D. L. Kwong, Extended Abstracts of the 1992 International Conference on Solid Devices and Materials, pp. 697–698).

In addition, there is a method where the capacitance can be increased about 70% without a decrease in reliability. This is accomplished by forming the surface of the silicon electrode into a rugged morphology and using $Ta_2O_5$ as the capacitor dielectric film (refer to H. Watanabe, T. Tatsumi, T. Niiono, A. Sakai, S. Adachi, K. Koyama and T. Kikkawa, Extended Abstracts of the 1991 International Conference on Solid Devices and Materials, pp. 478–480). In this case, the capacitance is about 12.5 $fF/\mu m^2$. Thus, it is possible to apply the $Ta_2O_5$ film so long as no reproducibility problem occurs.

However, if the silicon layer is used as the lower electrode of the capacitor in the above structure, the dielectric constant of the $Ta_2O_5$ film decreases due to the oxide or nitride film formed by the oxidation or nitridation, regardless of the surface morphology. Thus, large capacitance cannot be obtained.

Due to the aforementioned problems another type of capacitor has been proposed. In this capacitor structure, a refractory metal (e.g., tungsten (W), titanium nitride (TiN), molybdenum (Mo), etc., or a refractory metal silicide, e.g., tungsten silicide ($WSi_2$), tantalum silicide ($TaSi_2$), cobalt silicide ($coSi_2$), etc.) is used as the lower electrode instead of the silicon layer. Accordingly, the inherently high dielectric constant of the high dielectric can be obtained, thereby increasing the effective area of the capacitor. This structure will be described below with reference to the attached drawings.

Figure 1:
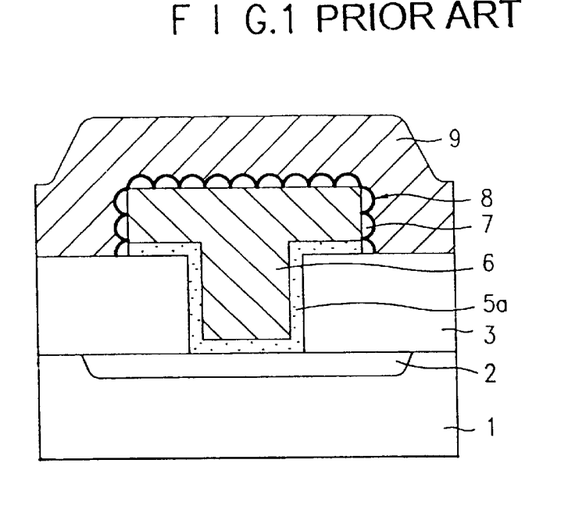
FIG. 1 is a cross-sectional view of the structure of a conventional capacitor.

As shown in FIG. 1, the capacitor is comprised of a semiconductor substrate 1 wherein an impurity diffused region 2 is formed. An insulating film 3 is formed on the semiconductor substrate 1 with a contact hole 4 (of FIG. 2a). A Ti layer 5a is formed on the insulating film 3 and in the contact hole 4 (of FIG. 2a). A TiN layer 6 is formed on the Ti layer 5a and fills the contact hole 4 (of FIG. 2a). A tungsten film 7 is formed on the entire surface of the outer side of the TiN layer 6 and the Ti layer 5a. A dielectric film 8 is formed on the surface of the tungsten film 7, and an upper electrode 9 is formed on the entire surface of the substrate.

A method of manufacturing the aforementioned conventional capacitor will be described with reference to FIGS. 2a to 2e.

Figure 2A:
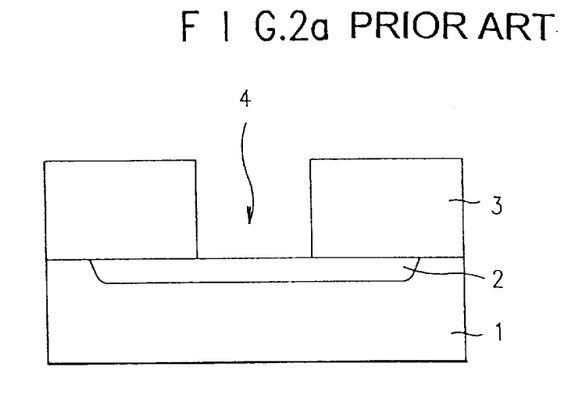
FIGS. 2a to 2e are progressive cross-sectional views of the conventional capacitor of FIG. 1 as it manufactured.

As shown in FIG. 2a, a semiconductor substrate 1, wherein an impurity diffused region 2 is formed in the surface, is prepared. An insulating film 3 is then formed on the semiconductor substrate 1 and is etched selectively to form a contact hole 4 and to expose impurity diffused region 2.

Figure 2B:
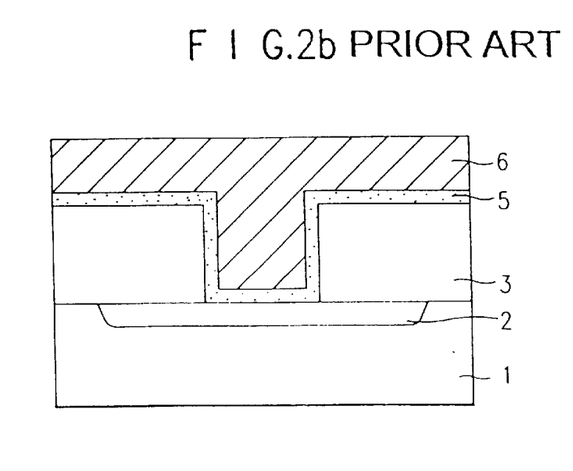

As shown in FIG. 2b, a Ti layer 5 and a TiN layer 6 are sequentially formed on the insulating film 3 and the impurity diffused region 2. The Ti layer 5 is deposited to maintain the ohmic contact with impurity diffused region 2. The TiN layer 6 is deposited to a thickness of about 0.5–1.0 $\mu m$.

Figure 2C:
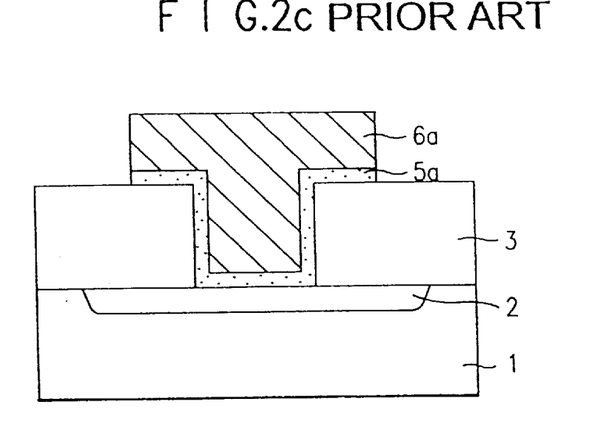

As shown in FIG. 2c, layers 5 and 6 are patterned to form a lower electrode using the lithography process.

Figure 2D:
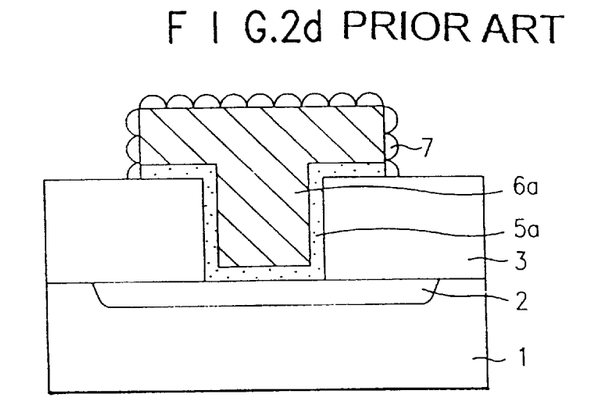

As shown in FIG. 2d., tungsten is selectively deposited to a thickness of about 50–150 nm on the outer surface of the Ti layer 5a and the TiN layer 6a to form a tungsten film 7. The tungsten is deposited by using $WF_6$—$H_2$, or $WF_6$—$SiH_4$—$H_2$ at a temperature of 250–450° C., through the LPCVD method. As a result, the tungsten film 7 has a rugged surface.

Figure 2E:
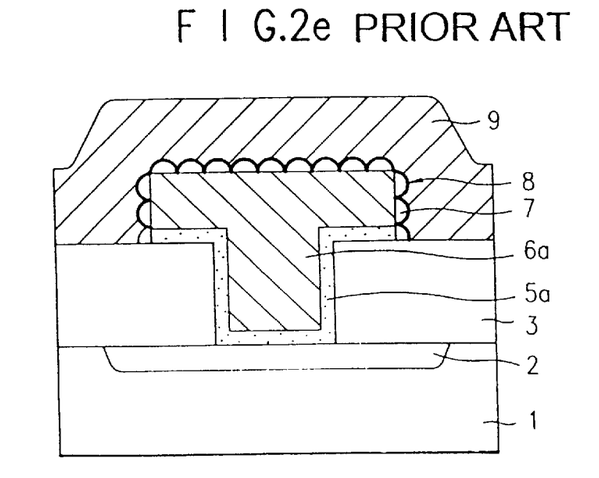

As shown in FIG. 2e, a capacitor dielectric film 8, e.g., a $Ta_2O_5$ film, is formed on the entire surface of the tungsten film 7, and then heat treatment is performed. Lastly, an upper electrode 9 is formed on the entire surface of the substrate, to complete the capacitor. This upper electrode is a refractory metal such as TiN, Mo, Co, Ta and W, or a metal silicide.

The conventional capacitor manufactured as described above has the following problems.

As shown in FIG. 2d, when the tungsten film 7 is deposited on the outer surface of the Ti layer 5a and the TiN layer 6a, the tungsten nuclei generate more rapidly on the Ti material than on the TiN material. Thus, tungsten film 7 grows on the surface of the Ti layer 5a sooner than on the TiN layer 6a.

Accordingly, the resulting tungsten film is not uniformly deposited over both the Ti layer 5a and the TiN layer 6a. This nonuniform depositing of the tungsten makes it difficult to manufacture a reliable capacitor and adversely affects the reproducibility of the capacitor.

SUMMARY OF THE INVENTION

The present invention has been made in view of the above circumstances and has as an object a capacitor structure of a semiconductor device and a method of manufacturing the same, in which the effective capacitor area is increased to provide large capacitance suitable for highly integrated devices.

A further object of the present invention is a capacitor structure of a semiconductor device and a method of manufacturing the same, which is reliable and easily reproducible.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the capacitor structure of a semiconductor device of this invention comprises a semiconductor substrate, a first metal layer formed on the semiconductor substrate a nitridation-treated film formed on the first metal layer, a second metal layer formed on the first metal layer, a tungsten film formed on the entire surface of the outer side of the first and second metal layers and having a rugged surface, a dielectric film formed on the tungsten film, and an upper electrode formed on the dielectric film.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE INVENTION

Hereinafter, the present invention will be described with reference to the attached drawings.

Figure 3:
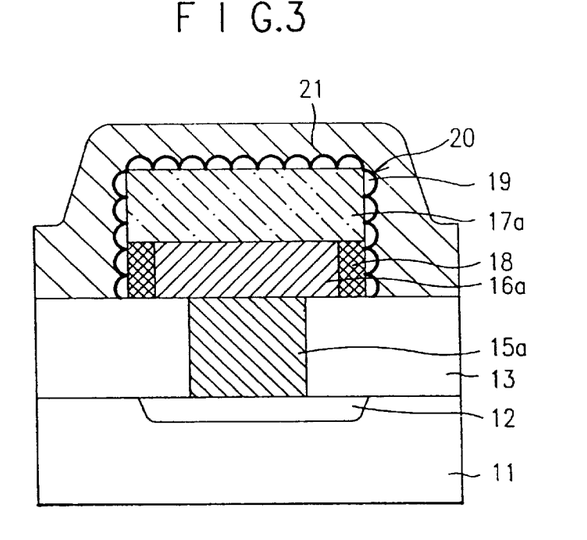
FIG. 3 is a cross-sectional view of the structure of a capacitor according to the present invention.

FIG. 3 is a cross-sectional view showing the structure of a capacitor according to the present invention.

Referring to FIG. 3, the capacitor is comprised of a semiconductor substrate 11 in which an impurity diffused region 12 is formed. An insulating film 13 is formed on the semiconductor substrate 11 and with a contact hole 14 (of FIG. 4a) therein. A silicon plug 15a is formed in the contact hole 14 (of FIG. 4a) to electrically connect with the impurity diffused region 12. A first metal layer 16a is formed on the insulating film 13 including over the upper portion of the silicon plug 15a. A nitridation-treated film 18 is formed on the pending of the first metal layer 16a. A second metal layer 17a is formed on the first metal layer 16a, and a tungsten film 19 having a rugged surface is formed on the entire outer surface of the first and second metal layers 16a and 17a. A dielectric film 20 is formed on the surface of the tungsten film 19, and a third electrode 21 is formed on the dielectric film 20.

The first metal layer 16a may be formed of Ti material. Further, the first metal layer 16a is formed to maintain ohmic contact with the impurity diffused region 12 formed in the surface of the semiconductor substrate 11.

Nitridation-treated film 18 formed on the outer peripheral surface of first metal layer 16a to prevent the tungsten from quickly growing on the Ti material layer.

The second metal layer 17a is formed of TiN material.

The lower electrode of the capacitor is formed from the second metal layer 17a and the tungsten film 19 formed thereon.

Further, it is preferable that the second metal layer 17a and tungsten film 19, which are used as the lower electrode, be composed of a refractory metal such as Mo and Cr, or a refractory silicide such as $WSi_2$, $TaSi_2$ and $CoSi_2$.

Where, as described above, a refractory metal or a refractory silicide is used as the lower electrode, the high dielectric constant of the dielectric film can be maintained, to increase the effective capacitor area.

The dielectric film 20 may be formed of $Ta_2O_5$ material.

Further, in addition to the $Ta_2O_5$ material, PZT, BST, and the like having a high dielectric constant can be used as the dielectric film 20.

The third metal layer 21 is formed as the upper electrode. It is preferable that the third metal layer 21 be formed of a refractory metal such as TiN, Mo or Ta, or a refractory silicide.

A method of manufacturing the capacitor having the above described construction will be described with reference to the attached drawings.

FIGS. 4a to 4h are cross-sectional views for illustrating a method of manufacturing the capacitor according to the present invention.

Figure 4A:
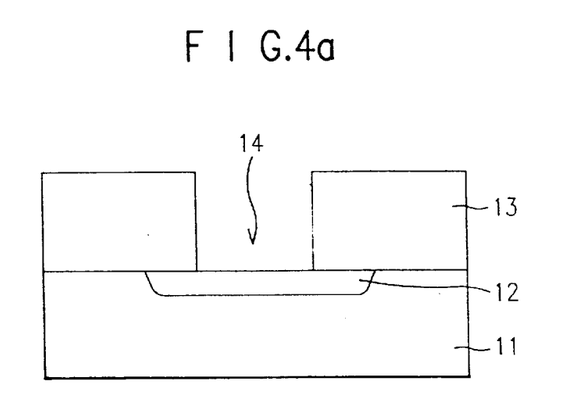
FIGS. 4a to 4h are the progressive cross-sectional views of the present invention as it is manufactured.

To begin with, as shown in FIG. 4a, an insulating film 13 is formed on a semiconductor substrate 11 in which an impurity diffused region 12 is formed. Then, the insulating film 13 is selectively etched by using a method such as the reactive ion etching (RIE) to form a contact hole 14 to expose impurity diffused region 12 on a predetermined portion.

Figure 4B:
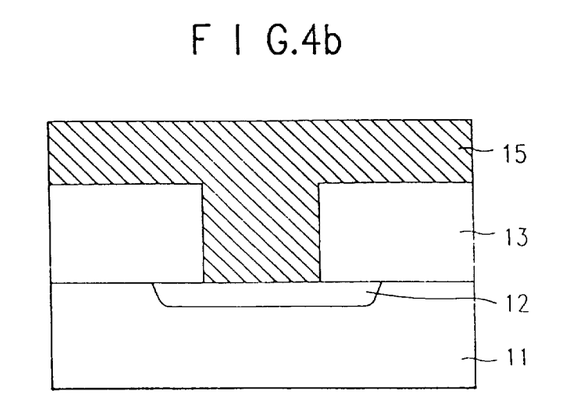

As shown in FIG. 4b, in order to electrically connect with the impurity diffused region 12, an impurity-doped semiconductor layer 15 is formed so as to completely fill the contact hole 14 (of FIG. 4a) on the insulating film 13. At this time, the semiconductor layer 15 is formed by depositing an impurity using the LPCVD method.

Figure 4C:
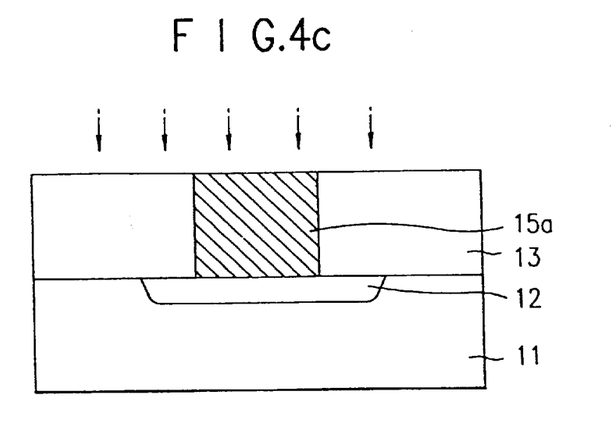

As shown in FIG. 4c, blanket dry etching is performed so that the semiconductor layer 15 of FIG. 4b remains in contact hole 14 (of FIG. 4a) to form a silicon plug 15a.

At this time, the endpoint of the blanket dry etching can be easily controlled because the etch selectivity between Si of semiconductor layer 15 and $O_2$ of the insulating film is very high.

Figure 4D:
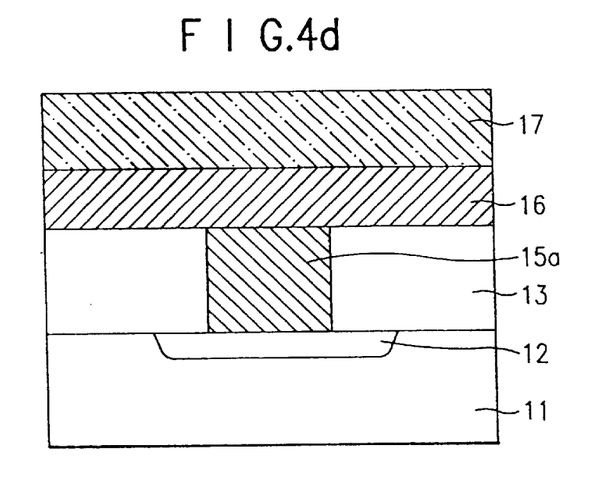

As shown in FIG. 4d, a first metal layer 16 and a second metal layer 17 are sequentially formed on the silicon plug 15a and the insulating film 13. The first metal layer 16 is formed by depositing Ti material according to the general deposition method or the coherent sputtering method. The thickness of the first metal layer 16 is about 0.1–0.5 times the thickness of the second metal layer 17. The second metal layer 17 is formed by depositing TiN material according to either the sputtering method, LPCVD method, or the organometallic CVD method. The second metal layer 17 is formed to a thickness of about 0.2–1.0 μm, considering the desired capacitance.

Figure 4E:
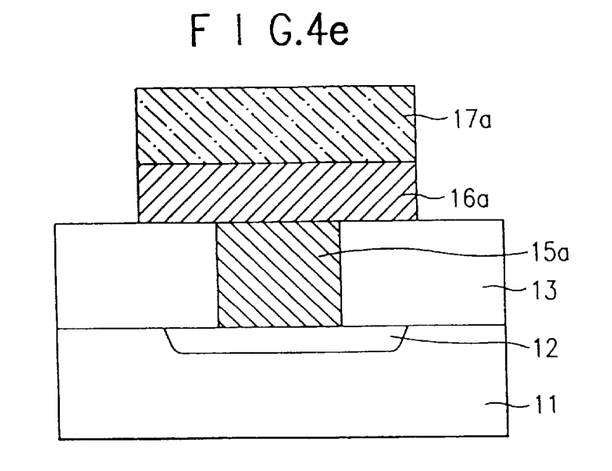

As shown in FIG. 4e, predetermined portions of the first and second metal layers 16 and 17 are patterned through the lithography process.

Before forming the tungsten film 19, the nitridation treatment process is performed on the entire surface of the etched first and second metal layers 16a and 17a. This is to help prevent the tungsten film 19 from growing on the Ti constituting the first metal layer 16a, earlier (sooner) than on the TiN constituting the second metal layer 17a. If the nitridation treatment did not take place, nuclei generation of the tungsten would occur on Ti before it occurred on TiN, and the outer sidewall of the first and second metal layers 16a and 17a would become completely surrounded. This would lead to the improper formation of the rugged tungsten film required for the present invention. Accordingly, in the present invention, the step of nitrifying the sidewall of the first metal layer 16a is performed first, without directly forming the tungsten film on the side of the Ti layer 5a and the TiN layer 6a, as shown in FIG. 2d of the conventional method.

Figure 4F:
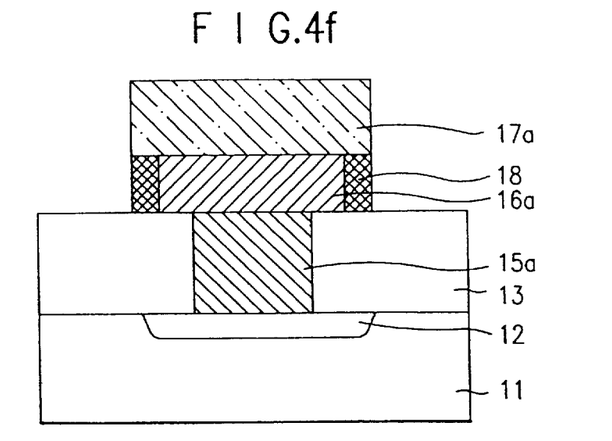

After performing the above etching process, the outer sidewall of the first metal layer 16a is nitridation-treated to form a nitridation-treated film 18 having a thickness of about 50 A or more in the sidewall.

The nitridation treatment of the sidewall of first metal layer 16a consisting of Ti material is performed at a temperature in the range from about 250° C. to about 600° C. by $NH_3$ or $N_2$ plasma. Alternatively, rapid thermal nitridation (RTN) is performed at a temperature anywhere in the range from about 500° C. to about 1000° C., using the rapid thermal processor (RTP).

Here, when first metal layer 16a is RTN-treated, it is effective in removing Cl impurities deposited from the $TiCl_4$ source and left within the TiN. Moreover, it is very effective in removing carbon (C) contained within the TiN deposited by the metalorganic CVD (MOCVD) method.

Figure 4G:
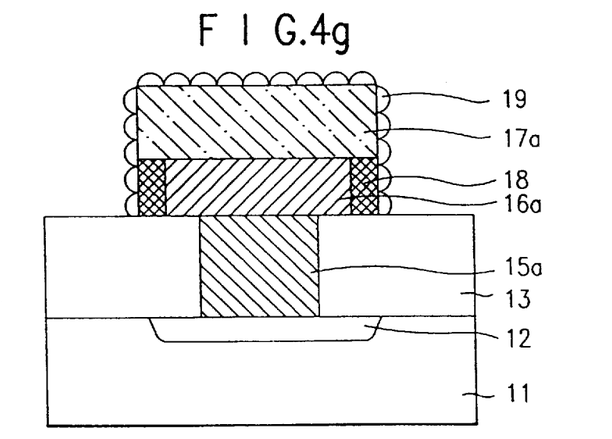

As shown in FIG. 4g, tungsten is deposited on the entire surface of the nitridation-treated first and second metal layers 16a and 17a to form a tungsten film 19 having the rugged surface. The tungsten is deposited through the selective deposition method using first and second metal layers 16a and 17a as seeds.

Further, in order to secure the uniformity or selectivity of the selective deposited tungsten and to reduce the delay of the deposition time in the second metal layer 17a, wet cleaning may be performed using the known method before depositing the tungsten.

The tungsten is deposited to a thickness of about 50–150 nm through the LPCVD method or the PECVD method at a temperature in the range of about 200–450° C., using $WF_6$—$H_2$, or $WF_6$—$SiH_2$—$H_2$, $WF_6$—$SiF_2$. In addition to $WF_6$, $WCl_6$ may be used as the deposition source of the tungsten. At this time, the deposition temperature is about 400–600° C.

A reducing gas, $Si_2H_6$, $Si_3H_2F$, and the like can be used in addition to $H_2$ or $SiH_4$. At this time, the deposition temperature can be properly controlled to obtain the same surface morphology of the tungsten as that obtained by using $H_2$ or $SiH_4$ reducing gas.

Using these methods, the rugged tungsten film 19 is formed to a continuous thin film to be used as the electrode. The number and size of the tungsten islands grow to make the impingement between the islands adjacent to each other, and to form the continuous thin film.

Figure 4H:
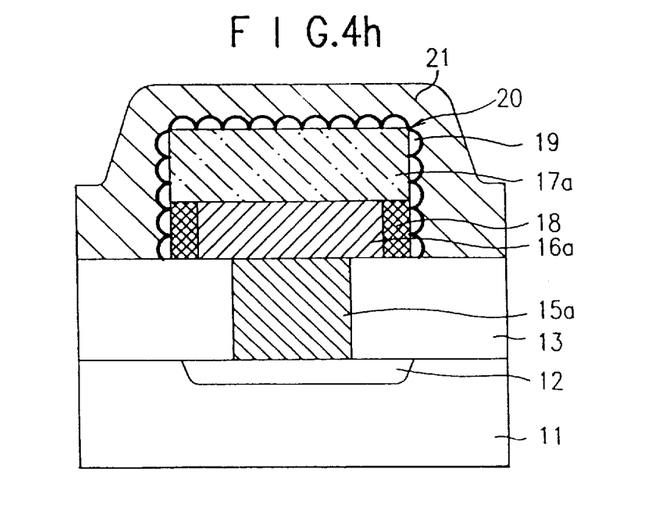

As shown in FIG. 4h, on the entire surface of the tungsten film 19, $Ta_2O_5$ is deposited by either the LPCVD, PECVD or ERCVD methods to form a dielectric film 20. The $Ta_2O_5$ is deposited by selecting from the above deposition methods, using a pentaethoxy-tantalum $(Ta(OC_2H_5)_5)$ as a source of Ta, and $O_2$ as a source of O. The deposition thickness of the $Ta_2O_5$ film is about 10–20 mm. Further, after depositing dielectric film 20, heat treatment is performed in order to maintain the stability of the thin film.

As an alternative to $Ta_2O_5$, PZT, BST and the like can be used as dielectric film 20. In this case, the film is formed to a thickness of 3 nm or less on the basis of the effective thickness of the $SiO_2$ film.

Lastly, a third metal layer, upper electrode 21, is formed on the dielectric film 20 and insulating film 13. It is preferable that a refractory metal such as TiN, Mo, Co, Ta and W, or a metal silicide is used as a material constituting upper electrode 21, instead of using Si. When polysilicon is used as the upper electrode, the silicon atom diffuses into the $Ta_2O_5$ film according to the subsequent heat treatment process to separate the Ta in the $Ta_2O_5$ film through the following chemical reaction equation:

$$2Ta_2O_5 + 5Si \rightarrow 4Ta + 5SiO_2$$

Thus, the dielectric strength of the capacitor is deteriorated.

Before forming upper electrode 21 of the capacitor on the dielectric film 20, a thin TiN film is formed on the dielectric film 20. As a result, variations in the characteristics of the dielectric film 20 can be minimized during performance of the subsequent heat treatment process.

As described above, a metal thin film having a rugged surface is formed on the entire surface of the second metal layer and the exposed surface of the first metal layer, so that it is used as the lower electrode. Thus, it is possible to control precisely the thickness of the dielectric film formed on the metal thin film.

The invention thus conceives of a way to manufacture a capacitor having a small leakage current and excellent reliability. In order to prevent the tungsten film from growing on the first metal layer earlier than on the second metal layer, the exposed sidewall portion of the first metal layer is nitridation-treated. The tungsten film thus forms uniformly on the entire surface of the first and second metal layers which better utilizes the sidewalls of the first and second metal layers and increases the capacitor area.

Moreover, when the nitridation-treatment of the sidewall of the first metal layer is performed, impurities such as Cl or C contained in the TiN material of the second metal layer deposited by the CVD method can be removed. Therefore, the integrity of the dielectric film formed on the second metal layer can be preserved.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A capacitor of a semiconductor device comprising:
    a semiconductor substrate;
    a first metal layer formed on said semiconductor substrate and having a nitridation-treated film formed on the outer side thereof;
    a second metal layer formed on said first metal layer;
    a tungsten film formed on the outer surface of said first and said second metal layers and having a rugged surface;
    a dielectric film formed on the surface of said tungsten film; and
    a third metal layer formed on said dielectric film.

2. A capacitor structure of a semiconductor device as claimed in claim 1, wherein said first metal layer is formed of a Ti material.

3. A capacitor structure of a semiconductor device as claimed in claim 1, wherein said second metal layer is formed of a TiN material.

4. A capacitor structure of a semiconductor device as claimed in claim 1, wherein said second metal layer is formed of a refractory metal.

5. A capacitor structure of a semiconductor device as claimed in claim 1, wherein said second metal layer is formed of a refractory silicide.

6. A capacitor structure of a semiconductor device as claimed in claim 1, wherein said dielectric film is formed of a $Ta_2O_5$ material.

7. A capacitor structure of a semiconductor device as claimed in claim 1, wherein said third metal layer is formed of a refractory metal.

8. A capacitor structure of a semiconductor device as claimed in claim 1, wherein said third metal layer is formed of a refractory silicide.

9. A capacitor structure of a semiconductor device comprising:
    a semiconductor substrate having an impurity diffused region;

an insulating film formed on said semiconductor substrate and having a contact hole;

a semiconductor layer formed in said contact hole to be electrically connected with said impurity diffused region;

a first metal layer formed on said insulating film including said semiconductor layer and having a nitridation-treated film formed on the outer side thereof;

a second metal layer formed on said first metal layer;

a tungsten film formed on the outer surface of said first metal layer and said second metal layer and having a rugged surface;

a dielectric film formed on said tungsten film; and an upper electrode formed on said dielectric film.

* * * * *